United States Patent [19]
Marks

[11] Patent Number: 5,748,844
[45] Date of Patent: May 5, 1998

[54] GRAPH PARTITIONING SYSTEM

[75] Inventor: Joseph W. Marks, Belmont, Mass.

[73] Assignee: Mitsubishi Electric Information Technology Center America, Inc., Cambridge, Mass.

[21] Appl. No.: 333,728

[22] Filed: Nov. 3, 1994

[51] Int. Cl.$^6$ .................................................. G06F 15/18
[52] U.S. Cl. .................................. 395/10; 395/12; 395/20
[58] Field of Search ............................... 364/488, 489, 364/490, 491; 395/20, 21, 22, 921

[56] References Cited

PUBLICATIONS

Saab, Youssef and Rao, Vasant, "Fast Effective Heuristics for the Graph Bisectioning Problem", IEEE Transactions On Computer–Aided Design, vol. 9, No. 1, pp. 91–98, Jan. 1990.
Shahookar, K. and Mazumder, P., "VLSI Cell Placement Techniques", ACM Computing Surveys, vol. 23, No. 2, pp. 143–220, Jun. 1991.

*Primary Examiner*—Tariq R. Hafiz
*Attorney, Agent, or Firm*—Robert K. Tendler

[57] ABSTRACT

A system is disclosed for computing an initial partition of a graph comprising nodes and the edges that connect the nodes. In one embodiment this initial partition is presented for subsequent use by the Kernighan-Lin system of graph partitioning. The Subject System uses a combination of a seed-growth heuristic and a stochastic-search process to compute an initial partition. The seed-growth heuristic builds a partition by iteratively augmenting an initial set of seed nodes. The search process searches for good sets of seed nodes to use. The resulting combination of seed-growth heuristic, stochastic-search process, and the Kernighan-Lin algorithm constitutes a superior system for partitioning graphs. The Subject System can be applied to graph-partitioning problems that arise in circuit design, computer architecture, routing in computer networks, database design, distributed and parallel processing, and many other domains.

4 Claims, 5 Drawing Sheets

GRAPH PARTITIONING SYSTEM

FIELD OF THE INVENTION

The invention relates to a system for partitioning graphs, and more particularly, to a prepartitioning system.

BACKGROUND OF THE INVENTION

A graph consists of a set of nodes and the edges that connect them. Graph partitioning is the name given to the problem of partitioning the set of graph nodes into subsets so that certain criteria (e.g., sizes of the subsets, numbers of edges between nodes in different subsets, etc.) are optimized. Several practical examples of this problem arise in computer circuit and chip design, where the graph nodes are circuit components, and the partitioning into subsets corresponds to the assignment of circuit elements to physical substrates, such as a layer in a semiconductor or a module of a printed circuit board. Other areas of application for graph partitioning include computer architecture, routing in computer networks, database design, and distributed and parallel processing. Current techniques for graph partitioning have limited success in automatically discovering and exploiting intrinsic structure in graphs, structure which arises from the nature of the application domain.

More specifically, the design of modern complex electronic systems is complicated by the fact that in addition to problems of component and circuit design caused by operational requirements, problems concerning the physical layout of the components must be considered. The circuit elements must be placed on physical supports such as chassis, printed circuit cards, or semiconductor substrates, and each of those structures has a fixed number of elements that it can hold and a fixed number of terminals by which it can be connected to the other supporting structures. In addition, practical problems often impose other constraints which must be satisfied. For example, electrical or mechanical considerations may dictate that a particular set of components be on the same structure or that certain components not be on the same structure.

In a large system, and especially in a large system that is to be mass-produced, it is important that the component layout problem not only be solved, but be solved efficiently. Since it is both easier and cheaper to connect components on the same structure than it is to connect components on different structures, the optimum solution should minimize the interconnections required between supporting structures.

A further constraint on the problem solution is that it must not only provide an efficient solution but must itself be efficient. That is, in view of the growing complexity of electronic systems, the method of solving the problem must be such that it can be done easily and rapidly. This implies that the method may not be overly dependent upon either the number of components to be assigned or the number of supporting structures available.

One of the most common partitioning systems, due to Kernighan and Lin, is described in U.S. Pat. No. 3,617,714, incorporated herein by reference, in which a method of partitioning the nodes of a graph into sets utilizes constraints on the maximum number of sets, the maximum number of nodes that can be assigned to a particular set, and a maximum number of edge connections that can be made to any one set. This method is utilized to minimize the interconnection cost of linked nodes and has been found to be useful not only for the design of near-optimal circuit layouts but also in the computer-aided design of VLSI circuits, networks, databases, the organization of distributed and parallel computations, and even the layout of graphical objects on displays. For instance, master-slice VLSI chip design has adopted partitioning techniques for placing components and for determining wiring patterns as illustrated in U.S. Pat. No. 4,593,363. Also, as illustrated in U.S. Pat. No. 4,577,276, a system is illustrated for the placement of components on circuit substrates utilizing a partitioning procedure involving separation of cells into maximally connected subcells.

Recently, more aggressive attempts have been made to exploit the intrinsic structure typically found in graphs of practical significance. The common approach adopted by one class of new systems is clustering: by grouping together nodes in tightly connected subgraphs, clusters of nodes can be treated as individual supernodes during the application of standard methods like Kernighan-Lin. Various incarnations of this idea are described in the following papers: T. Bui, C. Heigham, C. Jones, and T. Leighton, "Improving the Performance of the Kernighan-Lin and Simulated Annealing Graph Bisection Algorithms," in *Proc. of the 26th Design Automation Conference*, pp. 775–778, 1989; J. Cong and M. Smith, "A Parallel Bottom-Up Clustering Algorithm with Applications to Circuit Partitioning in VLSI Design," in *Proc. of the 30th ACM/IEEE Design Automation Conference*, pp. 755–760, June 1993; W. E. Donath, "Logic Partitioning," in B. Preas and M. Lorenzetti, eds., *Physical Design Automation of VLSI Systems*, pp. 65–86, Benjamin/Cummings, 1988; J. Garbers, H. J. Promel, and A. Steger, "Finding Clusters in VLSI Circuits," in *Proc. of the IEEE International Conference on Computer-Aided Design*, pp. 520–523, November 1990; M. K. Goldberg and M. Burstein, "Heuristic Improvement Technique for Bisection of VLSI Networks," in *Proc. of the IEEE International Conference on Computer-Aided Design*, pp. 122–125, 1983; L. Hagen and A. B. Kahng, "A New Approach to Effective Circuit Clustering," in *Proc. of the IEEE/ACM International Conference on Computer-Aided Design*, pp. 422–427, November 1992; B. Krishnamurthy, "An Improved Min-Cut Algorithm for Partitioning VLSI Networks," *IEEE Transactions on Computers* C-33:438–446, 1984; T.-K. Ng, J. Oldfield, and V. Pitchumani, "Improvements of a Mincut Partition Algorithm," in *Proc. of the IEEE International Conference on Computer-Aided Design*, pp. 470–473, 1987; and Y.-C. Wei and C.-K. Cheng, "A Two-Level Two-Way Partitioning Algorithm," in *Proc. of the IEEE International Conference on Computer-Aided Design* pp. 516–519, November 1990.

Another relatively recent idea is to use stochastic search, in particular a technique known as simulated annealing, to explore the space of possible partitions more thoroughly than the Kernighan-Lin algorithm does. This idea is explored in the following papers: D. S. Johnson, C. R. Aragon, L. A. McGeoch, and C. Schevon, "Optimization by Simulated Annealing: An Experimental Evaluation; Part I, Graph Partitioning," *Operations Research*, 37(6):865–892, 1989; S. Kirkpatrick, "Optimization by Simulated Annealing: Quantitative Studies," *Journal of Statistical Physics*, 34:975–986, 1984; and S. Kirkpatrick, C. D. Gelatt, Jr., and M.P. Vecchi, "Optimization by Simulated Annealing," *Science*, 220:671–680, 1984.

While these systems all offer some improvement over previous approaches, including the original Kernighan-Lin system, they are susceptible to further improvement. In particular, the various clustering systems do not make optimal use of good stochastic-search strategies, and the stochastic-search strategies do not exploit the concept of clustering in useful ways. The Subject Invention exploits the opportunity afforded by the novel and effective combination of a clustering heuristic and a powerful stochastic-search process.

The following articles describe various other prior graph partitioning methods and systems:

T. N. Bui, S. Chaudhuri, F. T. Leighton, and M. Sipser, "Graph Bisection Algorithms with Good Average Case Behavior," *Combinatorica* 7(2):171–191, 1987; C. M. Fiduccia and R. M. Mattheyses, "A Linear-Time Heuristic for Improving Network Partitions," in *Proc. of the 19th Design Automation Conference*, pp. 175–181, Las Vegas, N. Mex., 1982; B. W. Kernighan and S. Lin, "An Efficient Heuristic Procedure for Partitioning Graphs," *Bell System Technical Journal* 49(2):291–307, February 1970; U. Lauther, "A Min-Cut Placement Algorithm for General Cell Assemblies Based on a Graph Representation," in *Proc. of the 16th Design Automation Conf.*, pp. 1–10, San Diego, Calif. June 1979; B. Mazlish, S. Shieber, and J. Marks, "A Recursive Coalescing Method for Bisecting Graphs," Technical Report TR-94-10, Mitsubishi Electric Research Laboratories, Inc., Cambridge, Mass., May 1994; C. Sechen and A. Sangiovanni-Vincentelli, "TimberWolf 3.2: A New Standard Cell Placement and Global Routing Package," in *Proc. of the 23rd Design Automation Conf.*, pp. 432–439, June 1986; and, Y.-C Wei and C.-K. Cheng, "Ratio Cut Partitioning for Hierarchical Design," *IEEE Transacations on Computer-Aided Design*, 10(7):911–921, July 1991.

SUMMARY OF THE INVENTION

In accordance with the present invention, a system is provided for graph partitioning to enable better design of electronic circuits, computer and telecommunication networks, and other applications by combining a potent clustering system and a powerful stochastic-search system is achieved by using a seed-growth heuristic to accomplish clustering, and a parallel hill-climbing method to perform an effective stochastic search. In one embodiment, the partitions computed by this hybrid system are presented as initial partitions to the Kernighan-Lin algorithm, which is used to further refine these partitions. In one embodiment, the graph to be partitioned is created in a CAD/CAM machine on a screen. The CAD/CAM system then performs the subject improved partitioning to provide a near optimal partition which may then be used to display optimal positions of the elements in the graph.

More specifically, the seed-growth heuristic initially assigns a small number of randomly chosen nodes to each part of the partition; these are the seed nodes. A complete partition is constructed by iteratively augmenting the initial parts of the partition in such a way that unassigned nodes are assigned to the part of the partition that adversely effects the size of the resultant cut set (the number of edges from one part of the partition to the other) the least. This criterion for incrementally computing the partition implicitly disovers clusters in the graph, and ensures that clusters are rarely split between different parts of the partition, which would typically result in a larger cut set.

The behavior of the seed-growth heuristic is random, because it depends on the random selection of seed nodes. The stochastic-search process searches for good sets of seed nodes to use. This is accomplished by considering several randomly chosen sets of seed nodes at the same time. Each set of seed nodes is subjected to random perturbations by substituting non-seed nodes for seed nodes. Perturbations that improve the resulting partition are retained; otherwise they are rescinded. This is the well-known search strategy of hill climbing, as applied to several sets of seed nodes simultaneously. In addition, the least promising sets of seed nodes are replaced periodically by duplicate copies of the most promising sets of seed nodes. This search process terminates after a fixed number of perturbations have been considered, and some fraction of the best partitions found are then passed as input to the Kernighan-Lin algorithm for further refinement. Then the best refined partition is returned as the final solution.

This combination of seed-growth heuristic, stochastic-search process, and the Kernighan-Lin algorithm constitutes a superior system for partitioning graphs. In an experiment designed to compare the performance of the Subject Method with that of the Kernighan-Lin method on a number of graphs derived from industry-standard VLSI circuits, the Subject Method achieved up to a 45% improvement over the Kernighan-Lin method for some graphs, and demonstrated superiority on all tested graphs.

BRIEF DESCRIPTION OF THE DRAWINGS

These and other features of the Subject Invention will be better understood taken in conjunction with the Detailed Description in conjunction with the Drawing of which.

DETAILED DESCRIPTION

Figure 1:
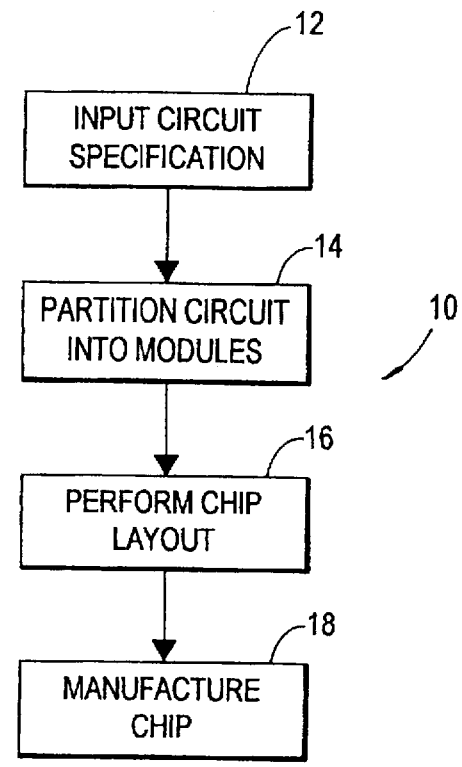
FIG. 1 is a block diagram illustrating a process for designing and manufacturing a computer chip, including the utilization of a partitioning subprocess for dividing the circuit into modules.

Referring now to FIG. 1, in one embodiment a process 10 is utilized in the layout and manufacture of a computer chip. In general, as illustrated at 12, the circuit specification is provided to enable the partitioning of the circuit into modules as illustrated at 14. After partitioning, a layout is computed, with the chip being laid out as illustrated at 16 in accordance with the optimal or near-optimal module partitioning. Thereafter, as illustrated at 18, the chip is manufactured in accordance with the layout specified by the layout step.

The degree to which an optimal or near-optimal partition is achieved depends on a number of factors. As mentioned before, the Kernighan-Lin partitioning algorithm improves upon an initial partition, typically one that is randomly generated. While the Kernighan-Lin partitioning system provides useful results, especially if run many times with different random initial partitions, it does not necessarily do so either in the most efficient manner or produce the best results.

In the past, the results achieved by Kernighan-Lin algorithm have been somewhat improved by careful preprocessing of the original circuit graph to arrive at refined initial partitions. However, preprocessing heuristics do not take full advantage of stochastic search, which refers to a randomized process for exploring a complex search space.

In the Subject Invention a preprocessing heuristic, which may be used by itself or in conjunction with the Kernighan-Lin algorithm, includes the combination of a specialized seed-growth heuristic and a specialized stochastic search process. As will be discussed in FIG. 4, the specialized seed-growth heuristic is based on the selection of a small percentage of the graph nodes at random to seed the two halves of the partition. This is followed by an iterative growth process, in which the nascent halves of the partition are augmented one node at a time until the partitioning is completed. Upon completion, the partition is inspected to determine its quality, which is measured by the size of the cut set, as determined by the number of edges or links that connect nodes in one part of the partition to nodes in the other part.

As will be discussed in FIG. 5, the above seed-growth heuristic is combined with a specialized stochastic search process, which involves the parallel exploration of several points in a search space.

Figure 2:
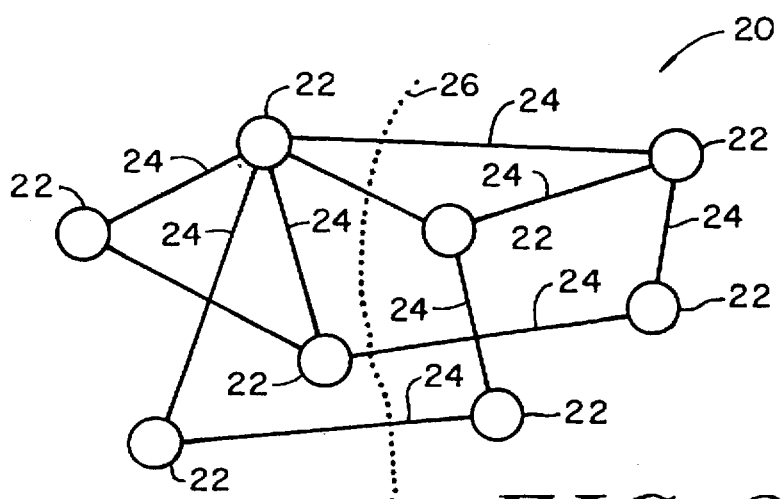
FIG. 2 is a diagrammatic illustration of the partitioning of a graph comprising a set of nodes and a set of edges or links.

Referring now to FIG. 2, in general, a graph 20 is comprised of nodes 22 and edges 24. The goal of any partitioning system is to divide the graph into two equal-sized sets as illustrated by dotted line 26 such that the number of edges from one part of the partition to the other (the size of the cut set) is minimized. The partition illustrated in FIG. 2 has a cut-set size of four, but this is not optimal; a partition with a cut-set size of three i s achievable. The graph-partitioning problem is a generalization of the graph-bisection problem in which the set N is to be divided into k subsets of equal cardinality, and each edge in E is assigned a weight: now the goal is to minimize the weighted sum of the edges between nodes in different subsets.

Figure 3:
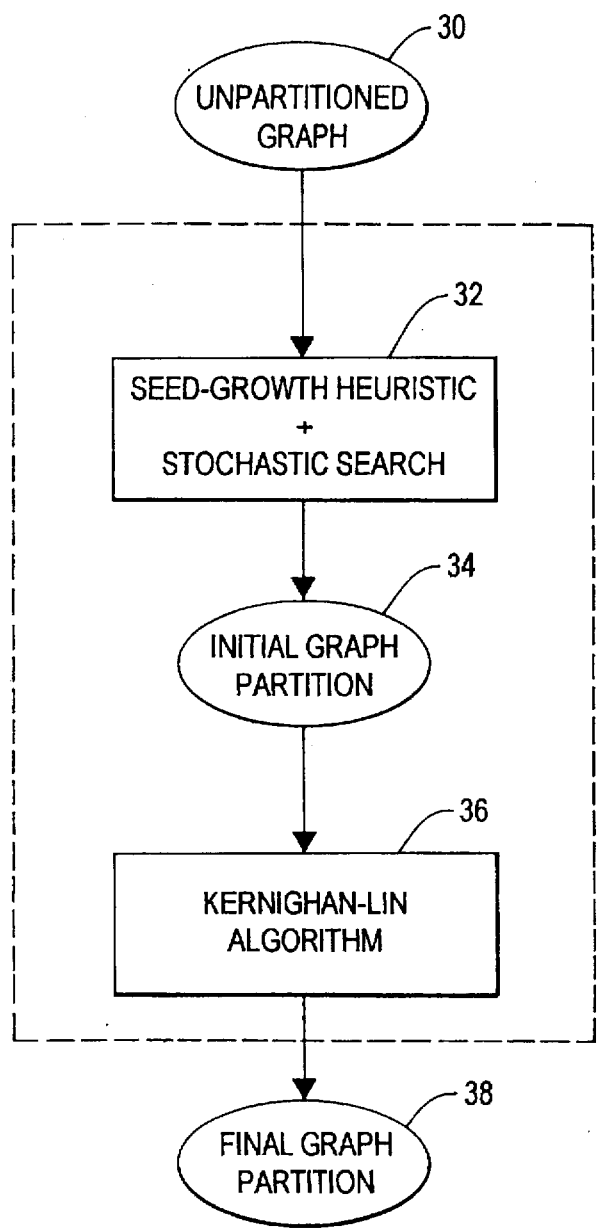
FIG. 3 is a block diagram illustrating the Subject Process for partitioning an unpartitioned graph utilizing a specialized seed-growth heuristic in combination with a specialized stochastic search process, followed optionally by application of the Kernighan-Lin algorithm to the initial graph partition computed by the combination of the seed-growth heuristic and the stochastic-search process, to provide a final graph partition.

In order to improve upon prior partitioning heuristics, and referring now to FIG. 3, in the Subject System an unpartitioned graph 30 is utilized as the input. As illustrated at 32, a seed-growth heuristic and stochastic search is applied to the unpartitioned graph to provide an initial graph partition 34. This initial graph partition may be used in and of itself for partitioning purposes; or is optionally used as the input to the Kernighan-Lin algorithm 36, which further refines the initial partition in accordance with the standard algorithm. The result is a final graph partition 38, which is in general superior to those produced by other techniques.

The Subject Algorithm is based on the following seed-growth heuristic:

Input:
    An undirected graph G=(N, E). The number of nodes in N, |N|, is assumed to be even.

Output:
    A partition of N into two subsets X and Y of size |N|/2, and the size of the cut set, which is the number of edges from nodes in X to nodes in Y.

Procedure:
1. Randomly assign 1% of the nodes in N to subset X, and 1% to subset Y. These nodes are the seeds of X and Y, respectively.
2. Repeat substeps A and B until all the nodes in N have been assigned to X or Y:
    A. Find the unassigned vertex a in N with the largest difference value with respect to X: this value is the number of edges from a to nodes already assigned to X minus the number of edges from a to nodes already assigned to Y. (If there is more than one vertex with the largest difference value, then arbitrarily pick one of them.) Assign vertex a to X.
    B. Find the unassigned vertex b in N with the largest difference value with respect to Y: this value is the number of edges from b to nodes already assigned to Y minus the number of edges from b to nodes already assigned to X. (If there is more than one vertex with the largest difference value, then arbitrarily pick one of them.) Assign vertex b to Y.
3. Compute the number of edges connecting nodes in X to nodes in Y (this is the size of the cut set).

Figure 4:
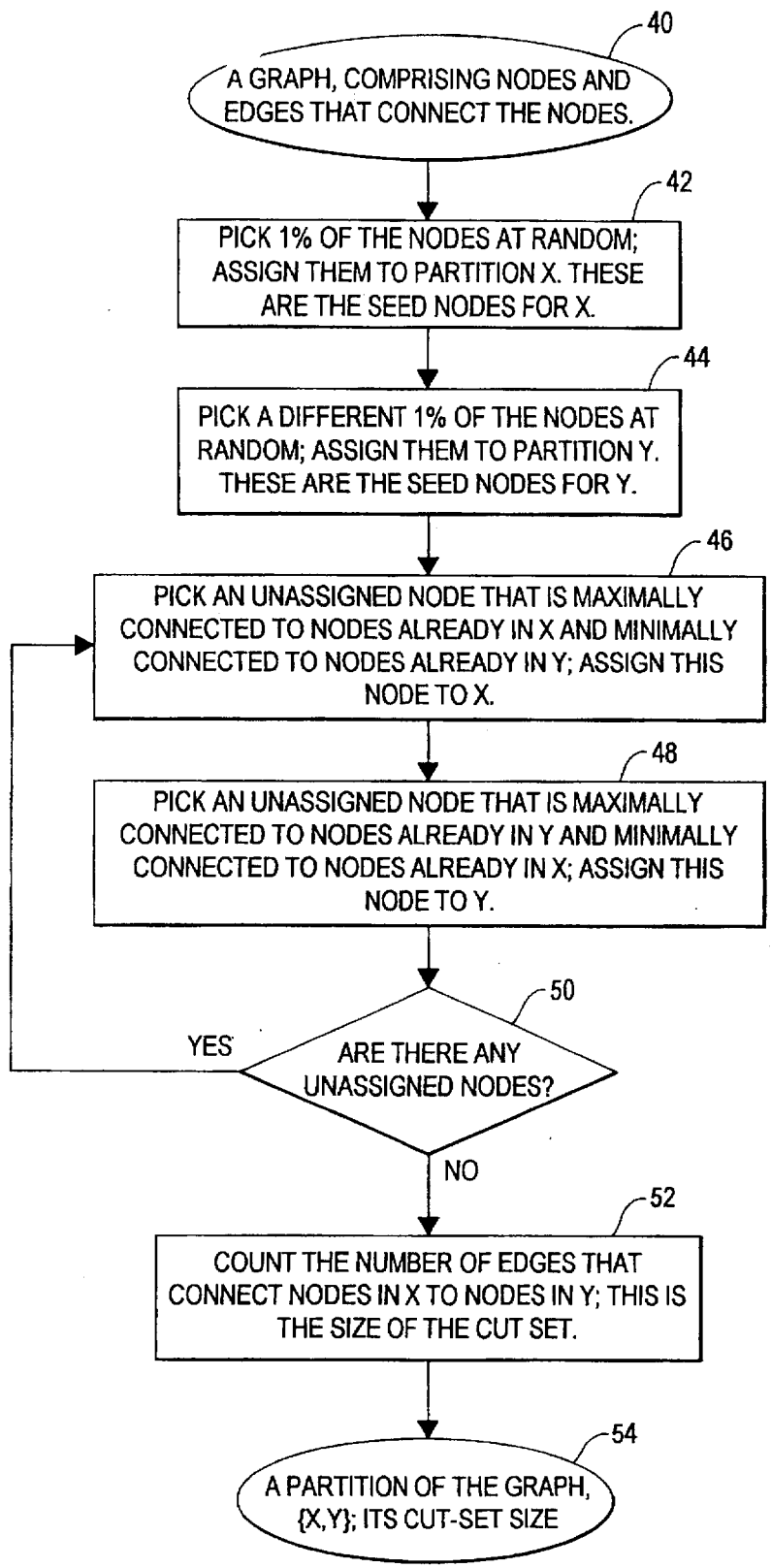
FIG. 4 is a block diagram illustrating the Subject seed-growth heuristic in which an initial graph partition is formed by augmenting an initial set of randomly chosen seed nodes; and, FIGS. 5A and 5B constitute a block diagram illustrating the combination of the seed-growth heuristic and a stochastic search process for generating initial graph partitions, which are then subsequently refined by application of the Kernighan-Lin algorithm.

More generally, and referring now to FIG. 4, the above algorithm is depicted by noting that a graph comprising the nodes and edges that connect the nodes 40 provides the data for the selection of a small percentage of the nodes at random. As illustrated at 42, 1% of the nodes are assigned to one half of the partition, called X, as seed nodes, with another disjoint 1% of the nodes being selected as seed nodes for the other half of the partition, Y, as illustrated at 44.

As illustrated at 46, an unassigned node that is maximally connected to nodes already in X and minimally connected to nodes already in Y is selected and is assigned to X, with the same being done for another unassigned node for Y, as illustrated at 48.

The iterative process continues until all unassigned nodes are assigned to X or Y, as illustrated at 50. Upon completion the number of edges that connect nodes in X to nodes in Y, defined as the size of the cut set, is determined as illustrated at 52. The resulting partition and cut-set size as illustrated at 54 is the final output of the seed-growth-heuristic portion of the Subject System.

One application of the seed-growth heuristic will compute a moderately useful graph bisection, but to be truly effective the seed-growth heuristic must be run multiple times as part of a general search procedure that incorporates the Kernighan-Lin heuristic as a postprocess. One such search procedure is given here. Other stochastic search procedures such as random generate-and-test, hill climbing, simulated annealing, and genetic algorithms are within the scope of this invention and may also be used effectively in tandem with the seed-growth and Kernighan-Lin heuristics.

It will be appreciated that the seed-growth heuristic is used most effectively with a stochastic search process, such as the specialized stochastic search process described below:

Input:
    An undirected graph G=(N, E). |N| is assumed to be even.

Output:
    A partition of N into two subsets X and Y of size |N|/2, and the size of the cut set.

Procedure:
1. Randomly choose a set P of 100 sets of seeds using Step 1 of the seed-growth procedure.
2. Compute the subsets $X_s$ and $Y_s$ and the value of the corresponding cut set for each member s of P using Steps 2 and 3 of the seed-growth procedure.
3. Repeat substeps A through E 5,000 times:
    A. Randomly pick a seed set s in P.
    B. Perturb s by removing one of its seeds and replacing it with another randomly chosen seed vertex from N; call the resulting seed-set s'.
    C. Compute the subsets $X_{s'}$ and $Y_{s'}$ and the cut set for s'.
    D. If the cut set for s' is as small or smaller than the cut set for s, then replace s in P with s'.

E. On iterations 1,000, 2,000, 3,000, and 4,000, perform the following steps:
   i. Rank order the members of P by size of their cut sets.
   ii. Replace the bottom 50 members of P with copies of the top 50 members of P.
4. Rank order the seed sets in P according to the size of their associated cut sets.
5. For each seed set t among the top 20 in P, apply the Kernighan-Lin heuristic to the partition $(X_t, Y_t)$ to obtain (if possible) an improved partition $(X_{t'}, Y_{t'})$.
6. Rank order the 20 improved partitions and return a partition with the smallest cut set.

Figure 5A:
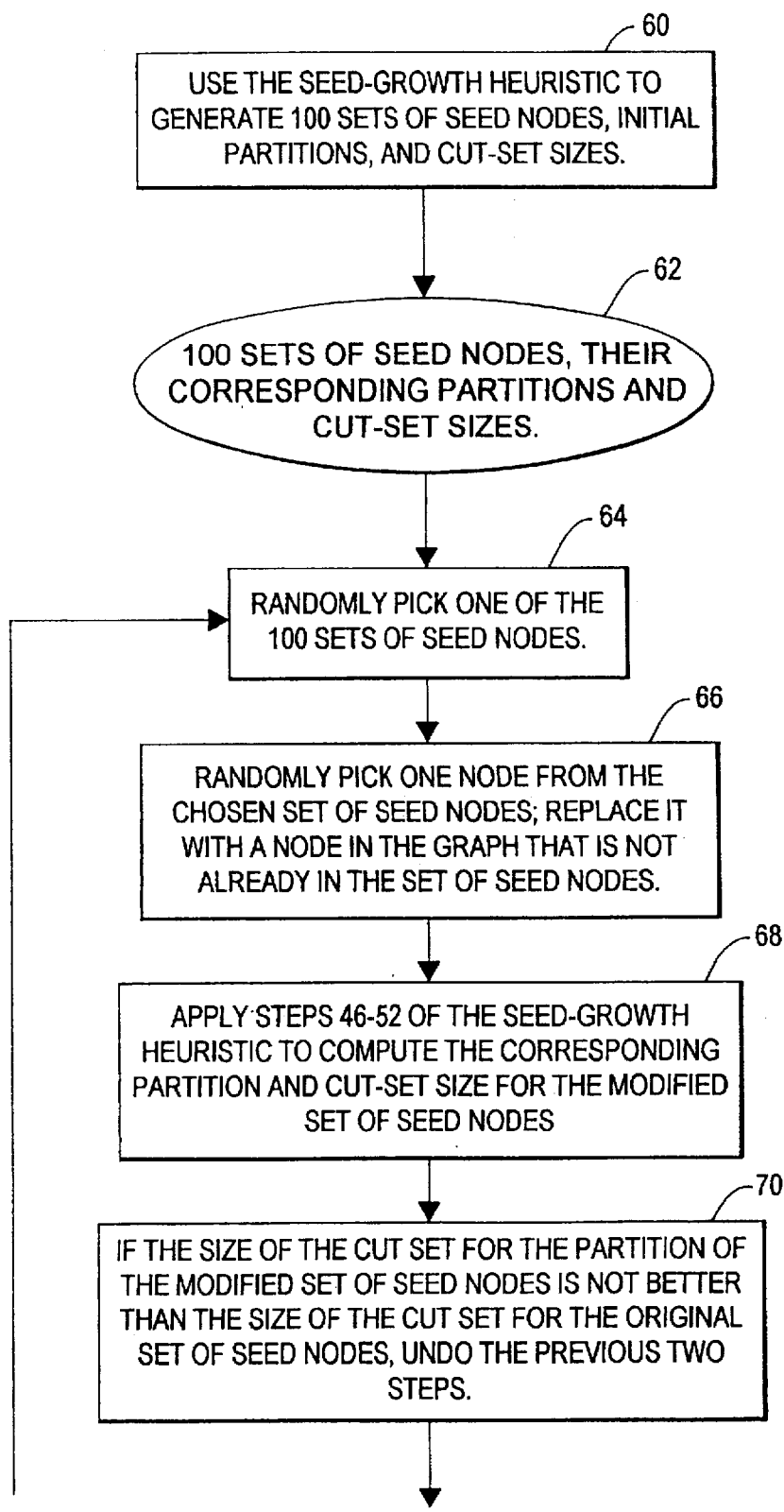
Figure 5B:
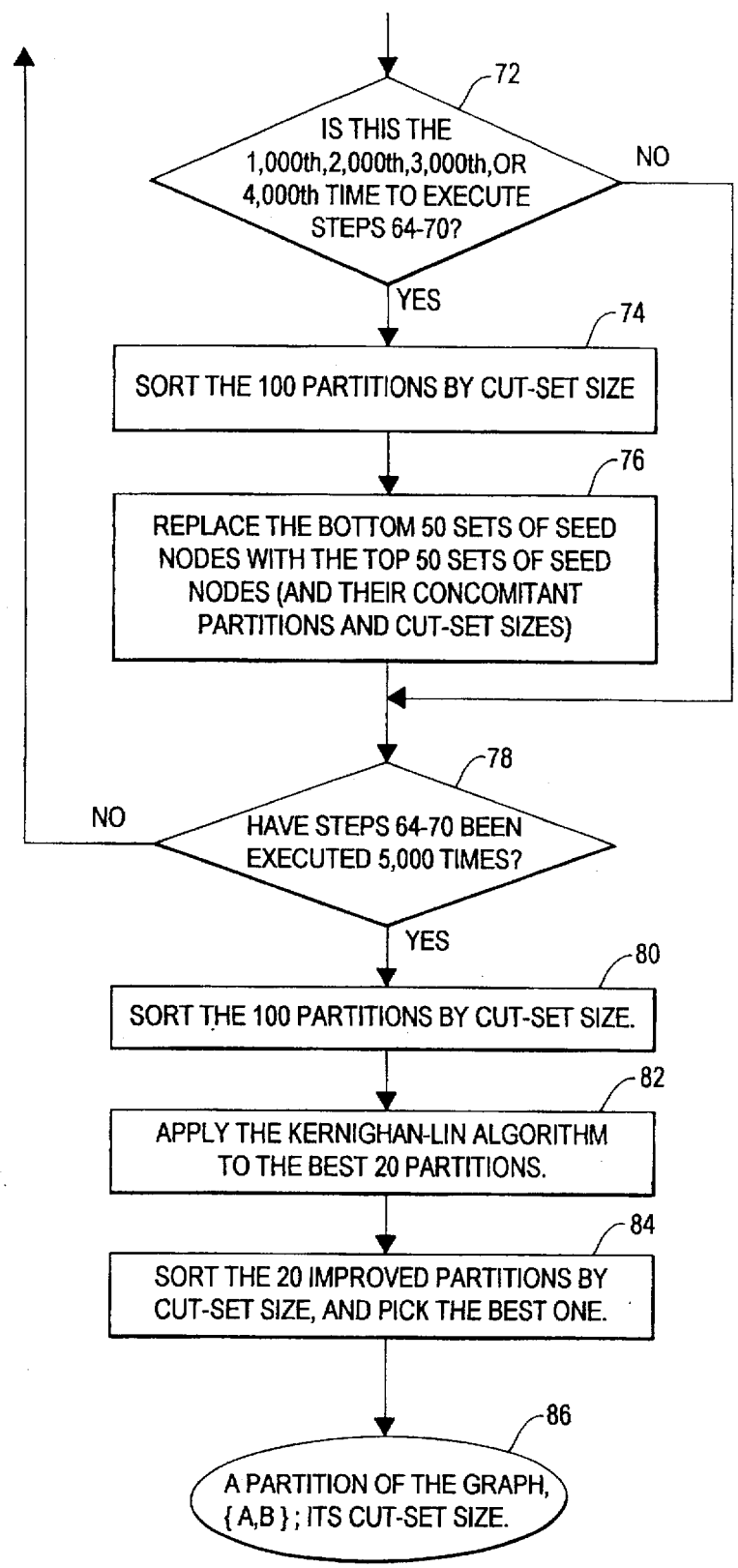

Referring now to FIGS. 5A and 5B, in one embodiment the above-mentioned seed-growth heuristic of FIG. 4 is utilized to generate a number of sets of seed nodes, initial partitions, and their corresponding cut-set sizes, as illustrated at 60. The result, as shown at 62, is utilized in a random-selection process 64 for the picking of one of the sets of seed nodes. As illustrated, 100 sets of seed nodes is used, although the number of seed sets is not critical.

After having picked one set of seed nodes, the composition of this set of nodes is modified, as illustrated at 66, by randomly substituting a non-seed node in the graph for one of the current seed nodes. The modification to the set of seed nodes necessitates the recomputation of the associated partition and cut-set size to ascertain if the substitution results in an improvement in cut-set size. This is illustrated at 68 and 70. It will be appreciated that if there is no improvement, the substitution resulting in an inferior cut-set size is disregarded.

As illustrated at 72, every 1,000 iterations through steps 64–70, the 100 partitions are sorted, as illustrated at 74. The bottom 50 sets of seed nodes are then replaced by copies of the top 50 sets of seed nodes, along with their associated partitions and computed cut-set sizes, as illustrated at 76. This operation is called reseeding.

As illustrated at 78, this process (steps 64–78) is iteratively performed for as many as 5,000 times, or any convenient number of times, to arrive at 100 superior partitions. As illustrated at 80, these partitions are sorted as to cut-set size, with the 20 best partitions subjected at 82 to processing by the Kernighan-Lin algorithm. Thereafter, and as illustrated at 84, these 20 best partitions, after processing by the Kernighan-Lin algorithm, are analyzed to pick the overall best partition in terms of cut-set size. The selected partition is returned as illustrated at 86 as the best graph-partitioning solution found.

It will be appreciated that the percentage of nodes originally selected, the number of seed-node sets, the number of iterations in the stochastic-search process, the interval between reseeding operations, and the number of partitions subjected to the Kernighan-Lin algorithm are not critical to the invention. All that is necessary is to select sufficiently large numbers of nodes, sets, and iterations, and a sufficiently large reseeding frequency to provide results as nearly optimal as possible given the complexity of the graph and available computational resources.

The seed-growth heuristic and search procedure described above are readily generalized to the general graph-partitioning problem, which may require that N be partitioned into an arbitrary number of equally sized subsets, and which may associate arbitrary weights with the edges in E.

The general version of the seed-growth heuristic requires the initial assignment of seeds to each subset, and the subsequent growth of all the subsets in parallel; the computation of the cut-set size requires the weighted summation of the edges between all pairs of subsets in the partition; in all other respects, the seed-growth heuristic and search procedure remain the same.

Further straightforward extensions of the techniques described above, for example to even more general versions of the graph-partitioning problem in which the subsets may have different size limits, or that arbitrarily constrain the membership of some subsets of the partition, are within the scope of this invention.

A program listing in C for the partitioning system described above is appended hereto.

Having above indicated several embodiments of the Subject Invention, it will occur to those skilled in the art that modifications and alternatives can be practiced within the spirit of the invention. It is accordingly intended to define the scope of the invention only as indicated in the following claims.

I claim

1. Apparatus including a computer having storage for rearranging computer data in graph format in said storage by partitioning a graph having nodes couple together by edges, the partitioning being the result of using two initial sets of randomly chosen seed nodes, one set of seed nodes for each portion of the resulting partition, as opposed to a pair of seed nodes, one node for each portion of the resulting partition, with the final partition from the two initial sets of seed nodes providing an optimized arrangement of said nodes and edges in a final partition such that said final partition has a minimum cut size, comprising:

means including said computer for providing a nascent graph partition from an unpartitioned graph, including means for initially selecting a number of seed nodes of said unpartitioned graph for one portion of said nascent partition, and a disjoint number of seed nodes of said unpartitioned graph for another portion of said nascent partition, thus to form two initial sets, each having multiple nodes so as to be able to represent a much larger set of potential partitions of the original graph as compared with the number of potential partitions possible utilizing only one node per portion of the partition;

means including said computer for selecting unassigned nodes of said unpartitioned graph for each of said portions base on maximal connection of an unassigned node to nodes already in one of said portions, thereby to augment the nascent partition, and for ascertaining cut size for the resulting partition;

means including said computer for performing a stochastic search on said initial sets of seed nodes as opposed to performing a stochastic search on the nodes of a whole graph as it has been partitioned, thus to produce a partitioned graph; and, means for outputting said partitioned graph to said computer storage.

2. The apparatus of claim 1, wherein said stochastic search means includes:

means coupled to said iterative selection means for generating a number of sets of seed nodes based on corresponding multiple initial partitions;

means for randomly selecting one of said sets of seed nodes;

means for substituting one of the seed nodes in said selected seed node set with a non-seed node and for recomputing the associated partition and corresponding cut set size; and, means for disregarding the set with said non-seed node if the cut size of the resulting partition is greater than that of the partition without said substitution.

3. The apparatus of claim 2, and further including means for iteratively randomly selecting one of said sets of seed nodes, substituting one of said sets of seed nodes in said selected seed node set with a non-seed node, recomputing the associated partition and corresponding cut set size, and disregarding the set with said non-seed node if the cut size of said corresponding partition is greater than that of the partition without said substitution.

4. For apparatus of claim 1 and further including means for performing a Kernighan-Lin partition on the results of said stochastic search.

* * * * *